(12) United States Patent
Bao et al.

(10) Patent No.: US 10,903,418 B2
(45) Date of Patent: Jan. 26, 2021

(54) LOW RESISTANCE ELECTRODE FOR HIGH ASPECT RATIO CONFINED PCM CELL IN BEOL

(71) Applicant: International Business Machines Corporation, Armonk, NY (US)

(72) Inventors: Ruqiang Bao, Niskayuna, NY (US); Nicole Saulnier, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/194,662

(22) Filed: Nov. 19, 2018

(65) Prior Publication Data
US 2020/0161543 A1   May 21, 2020

(51) Int. Cl.
*H01L 45/00* (2006.01)
*H01L 27/24* (2006.01)

(52) U.S. Cl.
CPC .......... *H01L 45/06* (2013.01); *H01L 45/1233* (2013.01); *H01L 45/1253* (2013.01); *H01L 45/1608* (2013.01)

(58) Field of Classification Search
CPC combination set(s) only.
See application file for complete search history.

(56) References Cited

U.S. PATENT DOCUMENTS

| | | | |
|---|---|---|---|
| 8,178,386 B2 | 5/2012 | Lung et al. | |
| 8,531,881 B2 | 9/2013 | Widjaja | |
| 8,772,906 B2 | 7/2014 | Brightsky et al. | |
| 9,293,199 B2 | 3/2016 | Krebs et al. | |
| 9,627,612 B2 | 4/2017 | Brightsky et al. | |
| 2006/0157683 A1* | 7/2006 | Scheuerlein | H01L 27/2409 257/4 |
| 2009/0072216 A1 | 3/2009 | Lung et al. | |
| 2010/0129947 A1 | 5/2010 | Lee et al. | |
| 2012/0032135 A1 | 2/2012 | Kuh et al. | |
| 2013/0299768 A1 | 11/2013 | Brightsky et al. | |
| 2014/0369113 A1 | 12/2014 | Krebs et al. | |
| 2016/0071653 A1 | 3/2016 | Lamorey | |
| 2016/0284993 A1* | 9/2016 | Tada | H01L 27/228 |
| 2018/0005786 A1 | 1/2018 | Navarro et al. | |

(Continued)

FOREIGN PATENT DOCUMENTS

| | | |
|---|---|---|
| CN | 102386324 B | 3/2014 |
| CN | 105449100 A | 3/2016 |

(Continued)

OTHER PUBLICATIONS

Liu et al.; "Design of Side Bottom-Electrode-Contact for High Density Phase-Change Memory Array"; Journal of Nanoscience and Nanotechnology; Oct. 2012; 6 pages.

(Continued)

*Primary Examiner* — Moazzam Hossain
(74) *Attorney, Agent, or Firm* — Cantor Colburn LLP; Robert Sullivan

(57) ABSTRACT

A phase change material ("PCM") device is described. A non-limiting example of the PCM device includes a bottom electrode including a low resistivity material and a PCM material over the bottom electrode. The PCM device has a top electrode over the PCM material.

13 Claims, 17 Drawing Sheets

(56) References Cited

U.S. PATENT DOCUMENTS

2019/0140173 A1* 5/2019 Huang .............. H01L 21/28568

FOREIGN PATENT DOCUMENTS

KR      20090070304 A      7/2009
KR      20110035061 A      4/2011

OTHER PUBLICATIONS

Liu et al.; "PVD TiN for Bottom Electrode of Phase Change Memory"; ECS Transactions; Mar. 2014; 7 pages.
Straten et al.; "ALD and PVD Tantalum Nitride Barrier Resistivity and Their Significance in via Resistance Trends"; The Electrochemical Society, ECS Transactions, 64 (9); 2014; 6 pages.

* cited by examiner

LOW RESISTANCE ELECTRODE FOR HIGH ASPECT RATIO CONFINED PCM CELL IN BEOL

BACKGROUND

The present invention generally relates to phase change material devices and more specifically, to a low resistance electrode for high aspect ratio confined PCM cells formed during back-end-of-line (BEOL) processing.

Devices based on phase change materials ("PCM") are being explored to implement and accelerate artificial intelligence ("AI") computing circuits. The computation is based on changing the PCM element gradually from a high resistance state, which is the amorphous phase, to a lower resistant state, which is the crystalline phase. The PCM device can be used as an analog resistor, where the value of stored data is represented by a continuously variable resistance, rather than a two state, or digital, value of high or low resistance.

SUMMARY

Embodiments of the present invention are directed to a phase change material ("PCM") device. A non-limiting example of the PCM device includes a bottom electrode including a low resistivity material and a PCM material over the bottom electrode. The PCM device has a top electrode over the PCM material.

Embodiments of the present invention are directed to a method for forming a PCM device. A non-limiting example of the method includes forming a low resistivity bottom electrode and depositing an etch stop layer above the bottom electrode. The method deposits an ILD layer, a sacrificial silicon nitride layer, and a titanium nitride hard mask layer above the etch stop layer. The method etches through titanium nitride hard mask layer, sacrificial silicon nitride layer, and the ILD layer exposing the etch stop layer above the bottom electrode. The method removes the titanium nitride hard mask layer and the sacrificial silicon nitride layer. The method deposits a liner within the ILD layer and on top of the etch stop layer and punches through the liner and an exposed portion of the etch stop layer to the bottom electrode. The method deposits a PCM material within the ILD layer, such that the PCM material is in electrical contact with the bottom electrode and forms a top electrode on top of the PCM material.

Embodiments of the present invention are directed to a method for forming a PCM device. A non-limiting example of the method includes forming a low resistivity bottom electrode and depositing an etch stop layer above the bottom electrode. The method deposits an ILD layer, a sacrificial silicon nitride layer, and a titanium nitride hard mask layer above the etch stop layer and etches through titanium nitride hard mask layer, sacrificial silicon nitride layer, and the ILD layer exposing the etch stop layer above the bottom electrode. The method removes the titanium nitride hard mask layer and deposits a liner within the ILD layer and the sacrificial nitride layer and on top of the etch stop layer. The method punches through the liner and an exposed portion of the etch stop layer to the bottom electrode and deposits a PCM material within the ILD layer and the sacrificial layer, such that the PCM material is in electrical contact with the bottom electrode. The method forms a top electrode on top of the PCM material.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
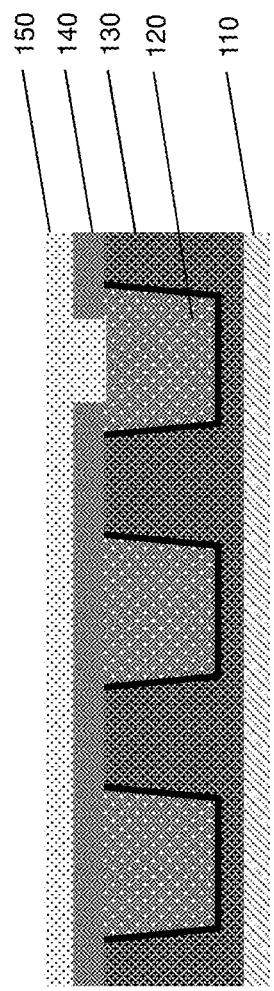
FIG. 1 depicts a semiconductor device during back end processing according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the present invention are described herein with reference to the related drawings.

Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

Turning now to an overview of technologies that are more specifically relevant to aspects of the invention, PCM material takes advantage of the large resistance contrast between the amorphous and crystalline states. The amorphous phase has high electrical resistivity, and the crystalline phase has a low resistivity. Oftentimes the difference in resistivity is three to four orders of magnitude. Thus, the change in read current is very large which provides for an opportunity for multiple analog levels that are needed for multi-level cell technology operations. As previously noted herein, a PCM device can be used as an analog resistor, where the value of stored data is represented by a continuously variable resistance, rather than a two state, or digital, value of high or low resistance. PCM devices tend to be used in an array with an access device controlling SET, RESET, and READ of the PCM device.

A PCM device includes a top electrode and a bottom electrode. During manufacture of a PCM device in a semiconductor device, a top titanium nitride hardmask is used to form a high aspect ratio PCM device in an ultra low-K back end of line ("BEOL") dielectric. Due to the necessary removal of the titanium nitride hard mask, the bottom electrode conventionally needs to be a different material to have a wet etch selective to titanium nitride. Tantalum nitride is often the chosen material for the bottom electrode because it cannot be removed by common titanium nitride removal through wet etching. However, tantalum nitride has very high resistivity which leads to a high resistance bottom electrode that necessarily degrades PCM performance.

Turning now to an overview of the aspects of the invention, one or more embodiments of the invention address the above-described shortcomings of the prior art by providing a method enabling the use of lower resistance materials, such as titanium nitride for the bottom electrode. This is accomplished by applying an etch stop layer above the bottom electrode. Thus, the bottom electrode is protected during the wet etch that removes the titanium nitride hard mask during the process of making the PCM device. In an alternative embodiment, an etch stop layer above the bottom electrode can be used in conjunction with an inner spacer liner, such as an oxide or nitride, lining PCM material in the PCM device. In another embodiment, a second etch stop layer can be used above the top electrode to permit the top electrode to be a lower resistance material, such as titanium or titanium nitride.

Turning now to a more detailed description of aspects of the present invention, FIG. 1 depicts a semiconductor device during back end processing according to embodiments of the invention. A semiconductor substrate 110 is provided having an interlayer dielectric ("ILD") layer 130. The front end of line transistors are fabricated on semiconductor substrate 110 before an interlayer dielectric ("ILD") layer 130 is deposited on top of the transistors. The ILD layer 130 is a low-k or ultra-low k (k<2.7) dielectric. Within the ILD layer 130 is at least one landing pad 120 for PCM cell which can be made of copper, for example. In an exemplary embodiment, the landing pad 120 can be about 70 to 100 nm in width and can be lined with tantalum nitride with Cobalt, Tantalum, or Ruthenium as wetting layer. A block nitride or block cap nitride 140 is deposited above the landing pad 120 and the ILD layer 130. The block nitride 140 is about 10-40 nm in thickness. Titanium nitride 150 is deposited, through ALD, PVD, or CVD, onto and exposed portion of the landing pad 120 and the block nitride 140. The exposed portion of the landing pad 120 is about 5 to 80 nanometers in width. The titanium nitride 150 forms a bottom electrode for a PCM device. Other low resistivity materials could also be used in place of titanium nitride, where low resistivity is defined as resistivity lower than tantalum nitride.

Figure 2:
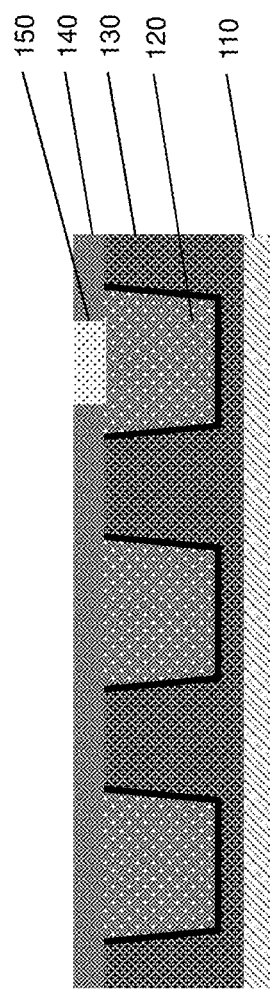
FIG. 2 depicts a semiconductor device during back end processing according to embodiments of the invention.

FIG. 2 depicts a semiconductor device during back end processing according to embodiments of the invention. The Titanium Nitride 150 is removed from the top of the block nitride 140 through chemical mechanical polishing. The remaining Titanium Nitride 150 will become the bottom electrode of the PCM device. The bottom electrode can also be a copper cap layer and titanium nitride, or it could be other low resistive materials.

Figure 3:
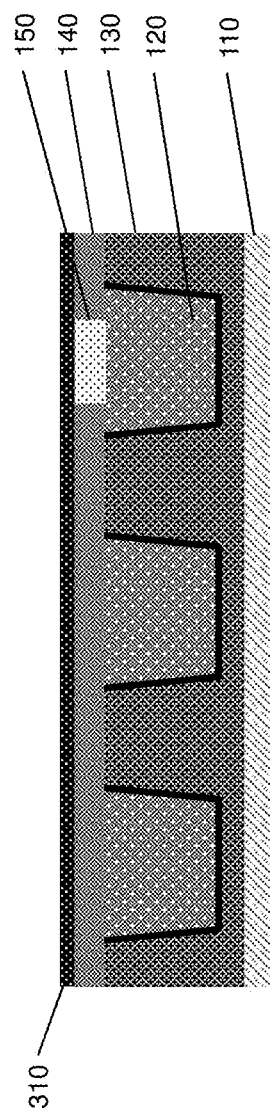
FIG. 3 depicts a semiconductor device during back end processing according to embodiments of the invention.

FIG. 3 depicts a semiconductor device during back end processing according to embodiments of the invention. An etch stop layer 310 is then deposited on the block nitride 140 and the titanium nitride 150. The etch stop layer 310 can be nitride, aluminum nitride, or aluminum oxide, for example.

Figure 4:
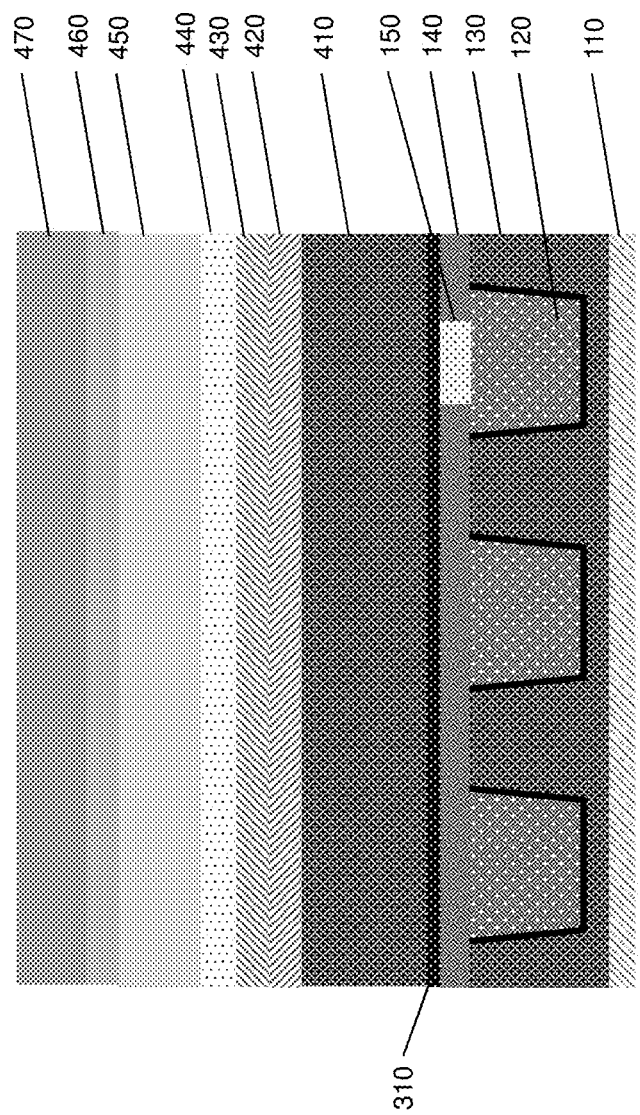
FIG. 4 depicts a semiconductor device during back end processing according to embodiments of the invention.

FIG. 4 depicts a semiconductor device during back end processing according to embodiments of the invention. A second ILD layer 410 having a height of, for example, between about 100 and about 150 nm is deposited above the etch stop layer 310. A sacrificial silicon nitride layer 420 of, for example, about 25 to 50 nm thickness is deposited over the second ILD layer 410. A titanium nitride hard mask layer 430 of, for example, about 10-40 nm thickness is deposited above the sacrificial silicon nitride layer 420. An about 10-40 nm thick tetraethyl orthosilicate ("TEOS") layer 440 is deposited above the titanium nitride hard mask layer 430. An approximately 100-300 nm thick organic planarization layer ("OPL") 450 is deposited above the TEOS layer 440. A silicon containing anti-reflective coating ("SiARC") layer 460 of, for example, about 20-60 nm thickness is deposited above the OPL 450. An approximately 100-1000 nm thick resist layer 470 is deposited above the SiARC layer 460.

Figure 5:
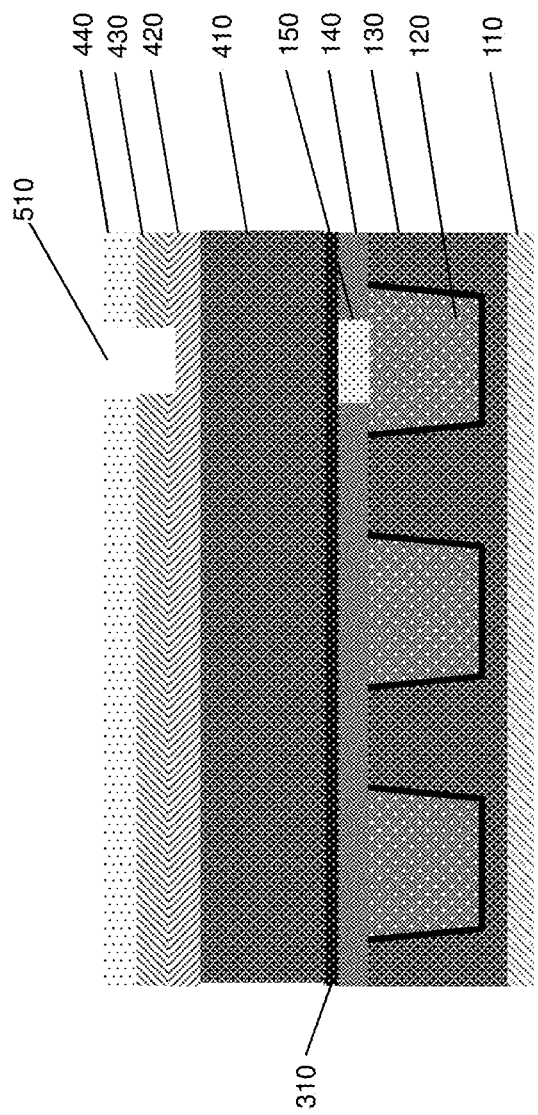
FIG. 5 depicts a semiconductor device during back end processing according to embodiments of the invention.

FIG. 5 depicts a semiconductor device during back end processing according to embodiments of the invention. The layers above TEOS layer 440 are removed, and the TEOS layer 440 and titanium nitride hard mask layer 430 is etched above the bottom electrode to form a trench 510 as part of a PCM patterning process.

Figure 6:
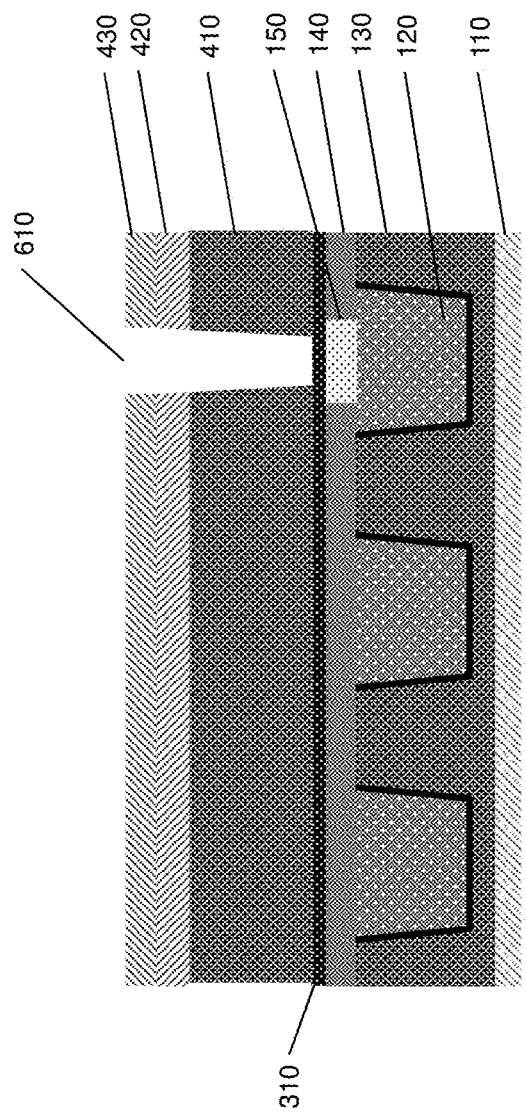
FIG. 6 depicts a semiconductor device during back end processing according to embodiments of the invention.

FIG. 6 depicts a semiconductor device during back end processing according to embodiments of the invention. Continuing the PCM patterning process, the second dielectric layer is etched above the bottom electrode using an ultra-low k etch forming a trench 610. The ultra-low k etch stops at the etch stop layer 310.

Figure 7:
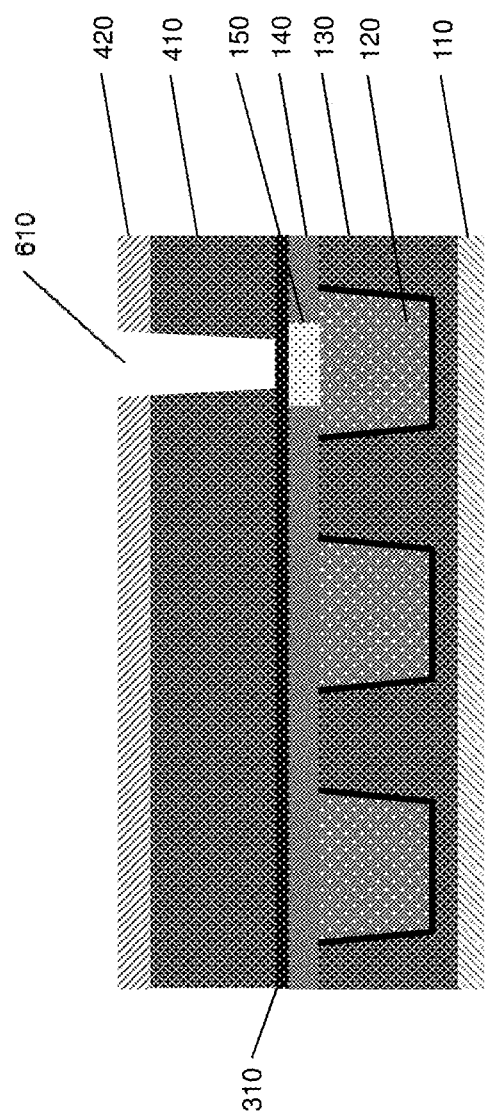
FIG. 7 depicts a semiconductor device during back end processing according to embodiments of the invention.

FIG. 7 depicts a semiconductor device during back end processing according to embodiments of the invention. Continuing the PCM patterning process, the titanium nitride hard mask layer 430 is removed via etching.

Figure 8:
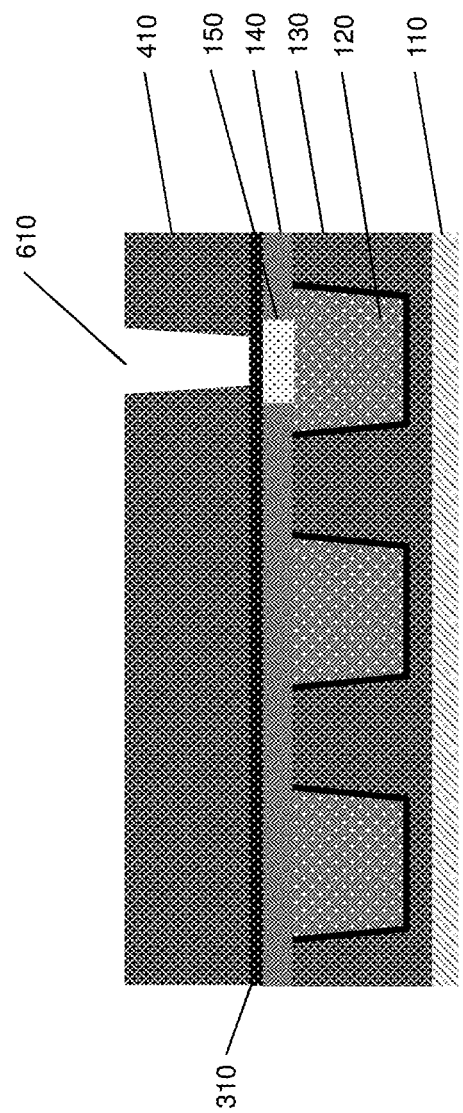
FIG. 8 depicts a semiconductor device during back end processing according to embodiments of the invention.

FIG. 8 depicts a semiconductor device during back end processing according to embodiments of the invention. During this stage of the PCM patterning process, the sacrificial silicon nitride layer 420 is stripped away.

Figure 9:
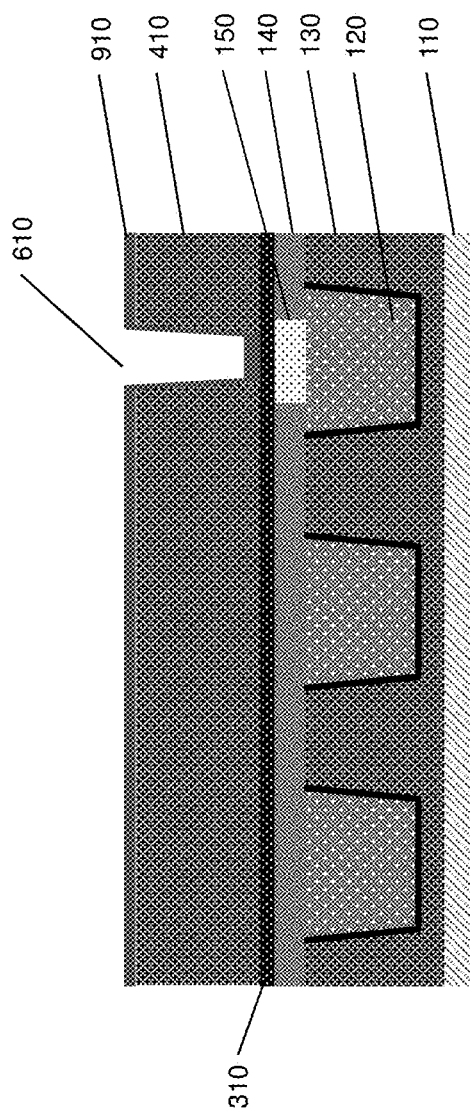
FIG. 9 depicts a semiconductor device during back end processing according to embodiments of the invention.

FIG. 9 depicts a semiconductor device during back end processing according to embodiments of the invention. At this stage of the PCM patterning process, an inner spacer liner 910 is deposited atop the second ILD layer 410, as well as on top of the exposed portion of the etch stop layer 310 and the sidewalls of the opening in the second ILD layer 410. The inner spacer liner 910 can be a nitride liner.

Figure 10:
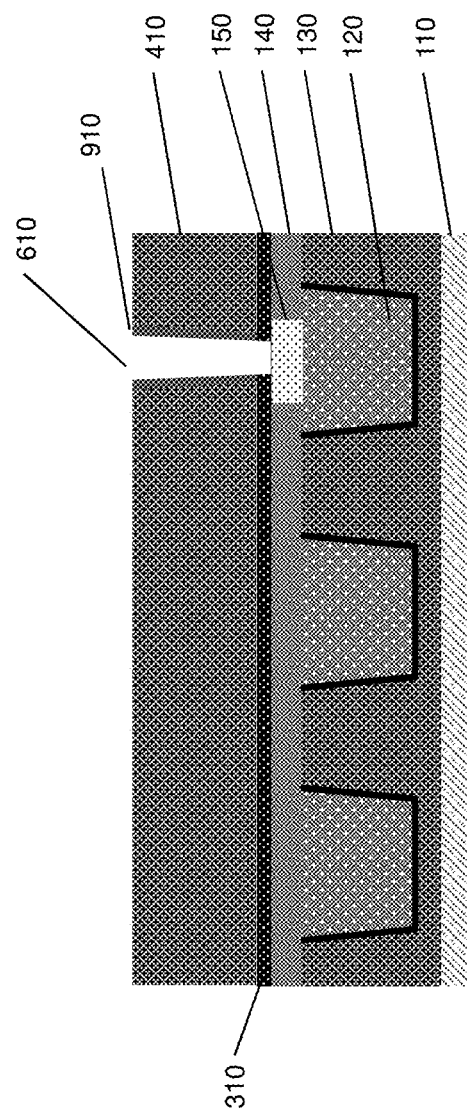
FIG. 10 depicts a semiconductor device during back end processing according to embodiments of the invention.

FIG. 10 depicts a semiconductor device during back end processing according to embodiments of the invention. At this point in the PCM patterning process, a resistive ion etch is performed to remove the inner spacer liner 910 from on top of the second ILD layer 410 and the bottom of the trench 610 in the ILD layer 410. The inner spacer liner 910 remains along the sidewall of the trench 610 in the second ILD layer 410. Also, the resistive ion etch removes the exposed portion of the etch stop layer 310 to in essence punch through to the titanium nitride 150 that forms the bottom electrode.

Figure 11:
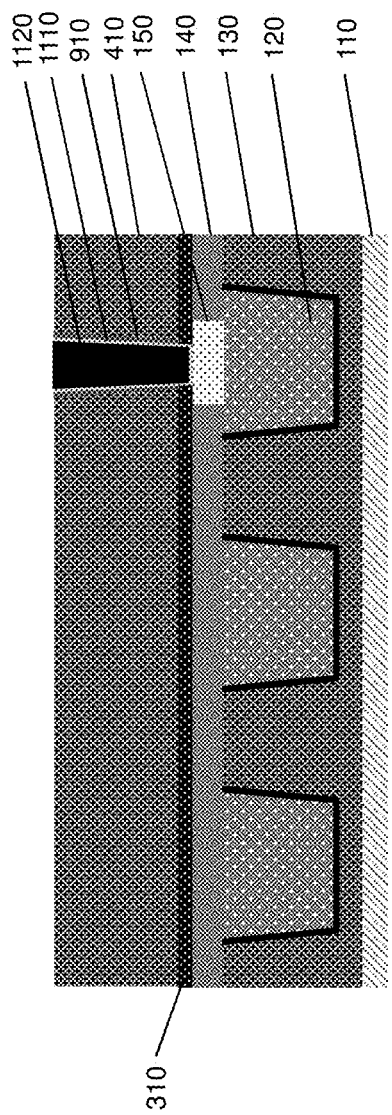
FIG. 11 depicts a semiconductor device during back end processing according to embodiments of the invention.

FIG. 11 depicts a semiconductor device during back end processing according to embodiments of the invention. PCM cell formation is the next stage. A tantalum nitride liner 1110 is deposited to line the trench 610 in the second ILD layer 410. Following that deposition, a PCM material 1120 is deposited within the tantalum nitride liner 1110.

Figure 12:
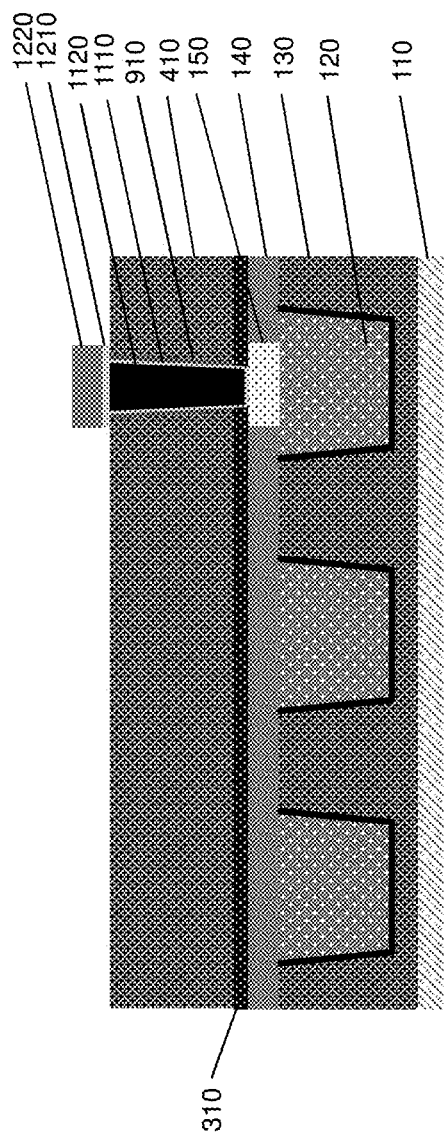
FIG. 12 depicts a semiconductor device during back end processing according to embodiments of the invention.

FIG. 12 depicts a semiconductor device during back end processing according to embodiments of the invention. A top electrode is formed on top of the PCM material 1120. The top electrode can have a bottom portion 1210 which is titanium and a top portion 1220 which is titanium nitride or a combination of titanium nitride and tantalum nitride. They are formed through deposition, patterning, and etching.

Figure 13:
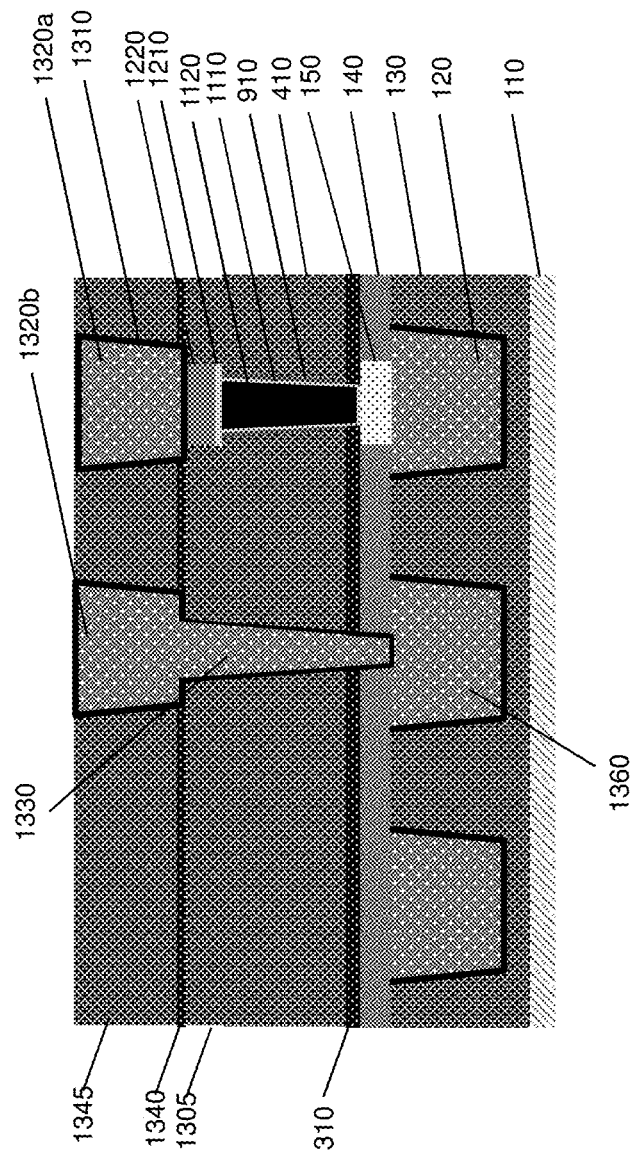
FIG. 13 depicts a semiconductor device during back end processing according to embodiments of the invention.

FIG. 13 depicts a semiconductor device during back end processing according to embodiments of the invention. A third ILD layer 1305 is deposited around the top electrode on top of the second ILD layer 410. A second etch stop layer 1340 is deposited above the top portion 1220 of the top electrode. Using conventional patterning and etching techniques, top wires 1320 can be placed within a fourth ILD layer 1345. The top wire 1320a above the top portion 1220 of the top electrode is in contact, though its tantalum nitride liner 1310, with the top portion 1220 of the top electrode. The top wire 1320b is in contact with a via 1330 formed through the third ILD layer 1305, second ILD layer 410, etch stop layer 310 and block nitride 140 to be in electrical communication with a landing pad 1360. The via 1330 has a tantalum nitride liner.

Figure 14:
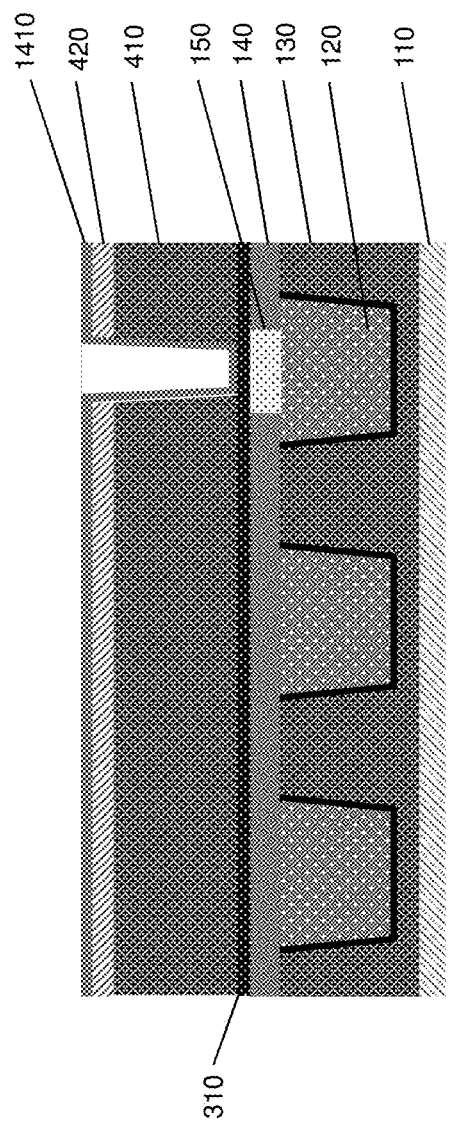
FIG. 14 depicts a semiconductor device during back end processing according to embodiments of the invention.

The following figures depict an alternative method for forming a PCM device with a relatively low resistance bottom electrode. FIG. 14 depicts a semiconductor device during an alternative stage of back end processing according to embodiments of the invention. This process occurs after the processing described with respect to FIG. 7 as an alternative processing method. During PCM patterning, an inner spacer 1410 including silicon nitride is deposited above the sacrificial layer 420 and along the sidewalls and bottom of the opening in the sacrificial layer 420 and the second ILD layer 410.

Figure 15:
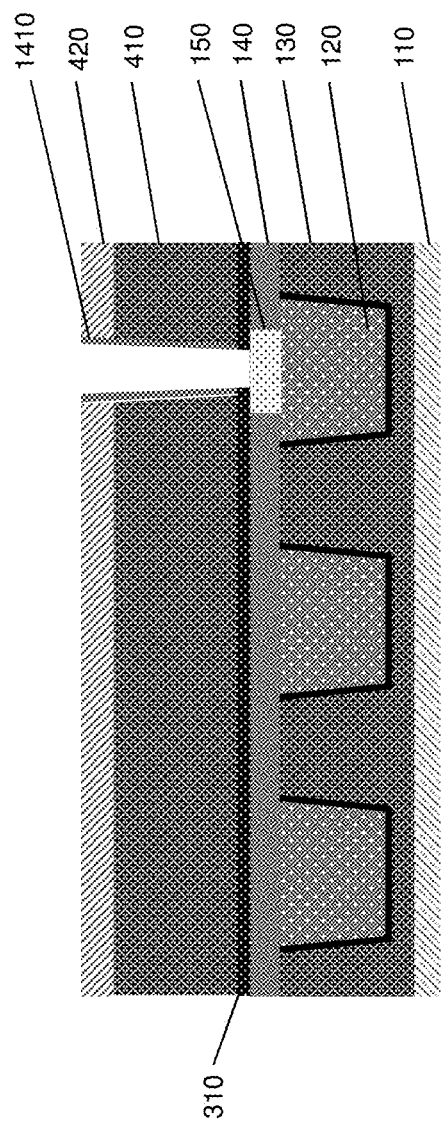
FIG. 15 depicts a semiconductor device during back end processing according to embodiments of the invention.

FIG. 15 depicts a semiconductor device during back end processing according to embodiments of the invention. The inner spacer is removed, using an resistive ion etch, from the top of the sacrificial layer 420 and the top of the titanium nitride 150 bottom electrode, leaving the inner spacer remaining only on the sidewalls of the opening in the sacrificial layer 420, second ILD layer 410, and etch stop layer 310.

Figure 16:
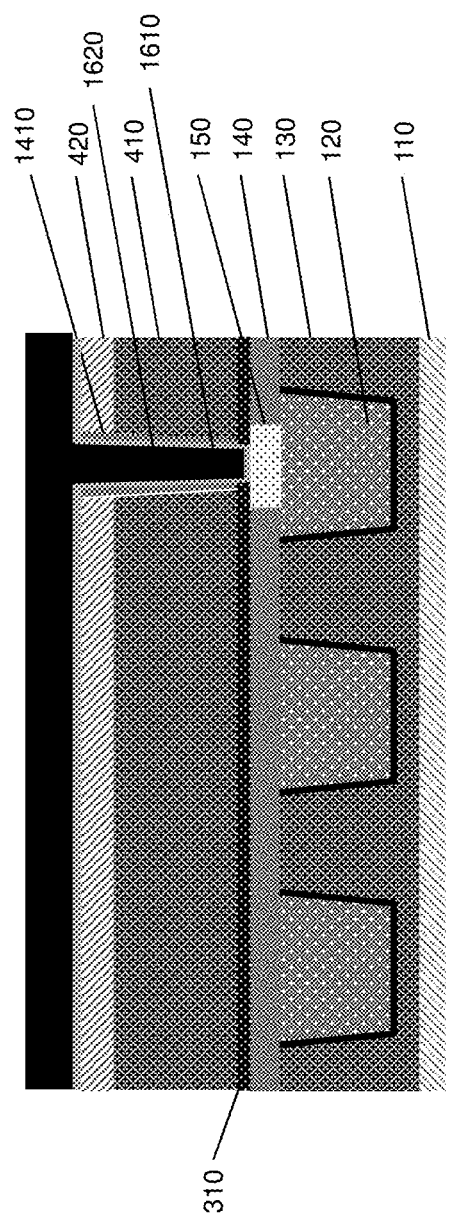
FIG. 16 depicts a semiconductor device during back end processing according to embodiments of the invention.

FIG. 16 depicts a semiconductor device during back end processing according to embodiments of the invention. A liner 1610 including tantalum nitride is deposited above the sacrificial layer 420 and along the opening in the sacrificial layer 420 and second ILD layer 410. Within the hole and on top of the liner 1610 PCM material 1620 is deposited.

Figure 17:
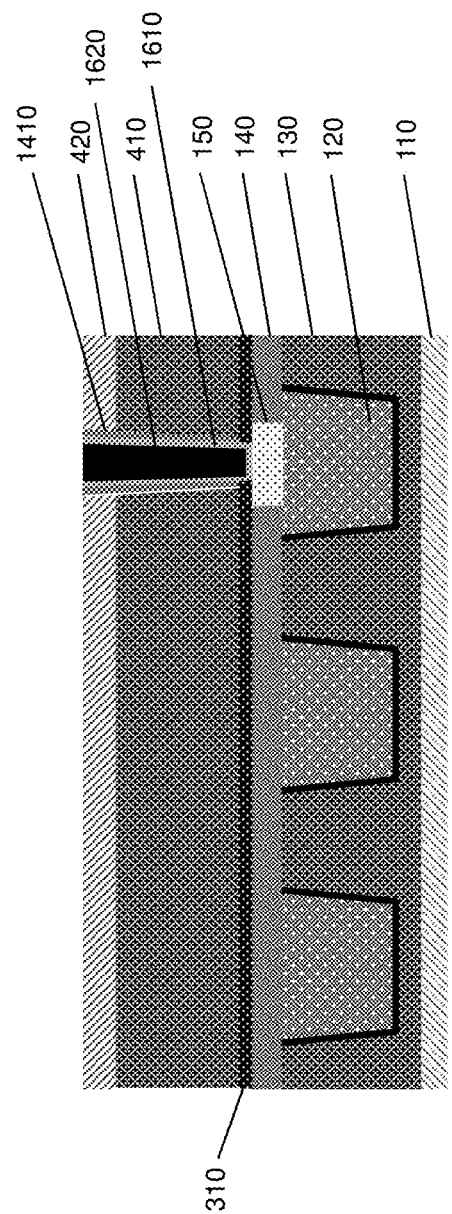
FIG. 17 depicts a semiconductor device during back end processing according to embodiments of the invention.

FIG. 17 depicts a semiconductor device during back end processing according to embodiments of the invention. Chemical mechanical polishing is performed to remove the liner 1610 and PCM material 1620, along with the sacrificial layer 420 from above the second ILD layer 410. Processing to create a top electrode, wires, and vias would then proceed as described with respect to FIGS. 12 and 13.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method of forming a PCM device, the method comprising:
   forming a low resistivity bottom electrode;
   depositing an etch stop layer above the bottom electrode;
   depositing an ILD layer, a sacrificial silicon nitride layer, and a titanium nitride hard mask layer stacked in sequence above the etch stop layer;
   etching through each of the titanium nitride hard mask layer, the sacrificial silicon nitride layer, and the ILD layer so as to expose the etch stop layer above the bottom electrode;
   responsive to etching through each of the titanium nitride hard mask layer, the sacrificial silicon nitride layer, and the ILD layer, removing the titanium nitride hard mask layer and the sacrificial silicon nitride layer;
   depositing a liner within the ILD layer and on top of the etch stop layer;
   punching through the liner and an exposed portion of the etch stop layer to the bottom electrode;
   depositing a PCM material within the ILD layer, such that the PCM material is in electrical contact with the bottom electrode; and
   forming a top electrode on top of the PCM material.

2. The method of forming a PCM device of claim 1 further comprising, prior to depositing the PCM material, depositing a second liner upon the liner and the exposed portion of the bottom electrode.

3. The method of forming a PCM device of claim 1, wherein forming the top electrode further comprises forming a bottom portion of the top electrode and forming a top portion of the top electrode.

4. The method of forming a PCM device of claim 1, wherein the bottom electrode is formed on a first landing pad.

5. The method of forming a PCM device of claim 1 further comprising forming a second ILD layer around the top electrode.

6. The method of forming a PCM device of claim 1 further comprising forming a wiring formation on top of the top electrode.

7. The method of forming a PCM device of claim 1 further comprising forming a third ILD layer around the wiring formation.

8. The method of forming a PCM device of claim 6 further comprising forming a second etch stop layer on top of the top electrode prior to forming the wiring formation.

9. The method of forming a PCM device of claim 4 further comprising forming a second landing pad adjacent the first landing pad, forming a second wiring formation in the third ILD layer and forming a via between the second wiring formation and the second landing pad.

10. A method of forming a PCM device, the method comprising:
    forming a low resistivity bottom electrode;
    depositing an etch stop layer above the bottom electrode;
    depositing an ILD layer, a sacrificial silicon nitride layer, and a titanium nitride hard mask layer stacked in sequence above the etch stop layer;
    etching through each of the titanium nitride hard mask layer, the sacrificial silicon nitride layer, and the ILD layer so as to expose the etch stop layer above the bottom electrode;
    responsive to etching through each of the titanium nitride hard mask layer, the sacrificial silicon nitride layer, and the ILD layer, removing the titanium nitride hard mask layer;
    depositing a liner within the ILD layer and the sacrificial nitride layer and on top of the etch stop layer;
    punching through the liner and an exposed portion of the etch stop layer to the bottom electrode;
    depositing a PCM material within the ILD layer and the sacrificial layer, such that the PCM material is in electrical contact with the bottom electrode; and
    forming a top electrode on top of the PCM material.

11. The method of forming a PCM device of claim 10 further comprising removing the sacrificial nitride layer after depositing the liner and prior to forming a top electrode on top of the PCM material.

12. The method of forming a PCM device of claim 10 further comprising, prior to depositing the PCM material, depositing a second liner upon the liner and the exposed portion of the bottom electrode.

13. The method of forming a PCM device of claim 10, wherein forming the top electrode further comprises forming a bottom portion of the top electrode and forming a top portion of the top electrode.

* * * * *